(12) United States Patent
Rogers et al.

(10) Patent No.: US 7,994,438 B2
(45) Date of Patent: Aug. 9, 2011

(54) HOUSING FOR AN ELECTRONIC CIRCUIT INTENDED FOR A BUILDING CONTROL SYSTEM

(75) Inventors: Michael Rogers, Hampstead, NH (US); Jonas Svennberg, Malmö (SE)

(73) Assignee: Schneider Electric Buildings LLC, North Andover, MA (US)

( * ) Notice: Subject to any disclaimer, the term of this patent is extended or adjusted under 35 U.S.C. 154(b) by 242 days.

(21) Appl. No.: 12/401,232

(22) Filed: Mar. 10, 2009

(65) Prior Publication Data
US 2009/0257198 A1 Oct. 15, 2009

Related U.S. Application Data

(60) Provisional application No. 61/071,101, filed on Apr. 11, 2008.

(51) Int. Cl.
*H05K 7/14* (2006.01)
(52) U.S. Cl. .......................... 174/542; 174/561; 361/726
(58) Field of Classification Search .................. 174/542, 174/561; 361/725, 726
See application file for complete search history.

(56) References Cited

U.S. PATENT DOCUMENTS

| 5,114,036 | A | 5/1992 | Liu |
| 5,253,143 | A | 10/1993 | Klinger et al. |
| 5,563,371 | A | 10/1996 | Rodi |
| 5,986,210 | A | 11/1999 | Kummle et al. |
| 6,999,320 | B2 | 2/2006 | Fan |
| 7,361,834 | B1 * | 4/2008 | Trangsrud et al. ............... 174/66 |
| 2004/0017651 | A1 * | 1/2004 | Gan et al. ...................... 361/685 |
| 2008/0013259 | A1 | 1/2008 | Barton et al. |

FOREIGN PATENT DOCUMENTS

| EP | 1 883 284 A2 | 1/2008 |
| JP | 2006-109626 A | 4/2006 |

OTHER PUBLICATIONS

European Search Report dated Aug. 26, 2008.

* cited by examiner

*Primary Examiner* — Hung V Ngo
(74) *Attorney, Agent, or Firm* — Buchanan Ingersoll & Rooney PC

(57) ABSTRACT

A housing (3) for an electronic circuit intended for a building control system is disclosed. The housing (3) comprises a first housing part (1) comprising the electronic circuit intended for the building control system, and a second housing part (2) that is connected to the first housing part (1). Furthermore, a handle (4; 5) is movably attached to and extractable from the first housing part (1) for providing a grip when the handle is extracted from the first housing part (1) and thereby allowing, by pulling the handle (4; 5), the first housing part (1) to be removed from the second housing part (2).

16 Claims, 11 Drawing Sheets

HOUSING FOR AN ELECTRONIC CIRCUIT INTENDED FOR A BUILDING CONTROL SYSTEM

TECHNICAL FIELD

The present invention generally relates to a housing for an electronic circuit intended for a building control system.

BACKGROUND

In various kinds of buildings, it is nowadays a common measure to control different systems, such as control systems for heating, ventilation and air conditioning (HVAC), security, lighting, asset management or other facility management control. Building control systems of this kind are becoming more sophisticated and complex due to computer aided control and use of communication technologies. These systems therefore often require several electronic control modules, e.g. in the form of enclosures or cabinets, to be arranged at various locations in the building to be controlled. The electronic control modules each comprises one or more housings, i.e. a cabinet or enclosure, for accommodating an electronic circuit intended for the building control system.

It is possible to use a two-part design of a housing comprising two separate housing parts that can be detachably connected to each other. In this way, the two housing parts can be detached or locked together. The first housing part may comprise one or several electronic circuits intended for the building control system. The second housing part may comprise one or more terminal blocks with wiring for connection to the building to be controlled. It is considered to be an advantage to have two separate housing parts that can be detachably connected to each other, since this allows for manufacturing the first and second housing parts separately. In turn, this allows for a modular housing solution that enhances flexibility. For example, the second housing part can be shipped and installed early in a building, whereas the first housing part, which comprises the electronic circuitry intended for the building in question, can be shipped and plugged into the second housing part later. For instance, this can be done once the building control system is ready for commissioning.

Nevertheless, there are still deficiencies with some currently available two part design solutions. For example, with some available solutions it may be difficult to detach or separate the two housing parts without damaging one or both of the housing parts. Thus, it may become cumbersome to replace the first housing part, which includes the electronic circuit(s) intended for the building control system, in the event an electronic circuit intended for the building control system malfunctions. Further, with some other available solutions the detachable housing parts are too loosely connected when the housing parts are in the connected state, thereby leading to the risk of causing the two housing parts to undesirably disconnect from each other.

SUMMARY OF THE INVENTION

In view of the foregoing, it is therefore an object of the present invention to mitigate, alleviate or eliminate one or more of the above-identified deficiencies or at least to provide an improvement of the above techniques. More particularly, it is an object to provide a housing that provides for simple and efficient replacement of an electronic circuit intended for a building control system.

According to a first aspect of the present invention, there is provided a housing for an electronic circuit intended for a building control system, wherein the housing comprises a first housing part comprising the electronic circuit intended for the building control system, and a second housing part that is connected to the first housing part. A handle is movably attached to and extractable from the first housing part for providing a grip when the handle is extracted from the first housing part and thereby allowing, by pulling the handle, the first housing part to be removed from the second housing part.

This inventive housing is advantageous in that the housing is easily opened, by virtue of the handle. This may allow for quick and efficient exchange of the electronic circuit intended for the building control system. For example, in the event that the electronic circuit intended for the building control system malfunctions, since the first housing part comprises this electronic circuit it is possible to replace the malfunctioning electronic circuit by simply replacing the whole first housing part including the malfunctioning electronic circuit with a new housing part comprising a new properly functioning electronic circuit. Moreover, since the handle is extractable, it is usually only extracted when the housing is to be opened, which may ensure protection of the handle itself. A further advantage with the inventive housing is that it enables replacement of the whole first housing part without affecting any wiring or cabling which may be present in the second housing part.

The first housing part may further comprise a guide for guiding a movement of the handle in a direction away from the second housing part, when the first housing part is connected to the second housing part. This may allow for a continuously directed movement for both extracting the handle and opening the housing.

The handle may comprise a protrusion or recess that is configured to engage with a blocking member of the first housing part, when the handle is extracted from the first housing part, for thereby preventing the handle to be detached from the first housing part. This may be advantageous in that the handle-extracting force is transferred into a house opening force once the handle is extracted and engages the blocking member. Since the blocking member is comprised in the first housing part, the first housing part can be removed from the second housing part by virtue of a force applied to the handle.

The handle may comprise a further protrusion or recess that is configured to engage with the guide of the first housing part, when the handle is inserted into the first housing part. This may allow for keeping the handle in place, in particular when the extracting direction of the handle is vertical.

The handle may comprise a grip-part and two substantially parallel legs extending from the grip-part. This has shown to provide a particularly suitable shape of the handle.

Any of the first housing part and the second housing part may comprise hook-means that are configured to engage the other one of the two housing parts in a locking manner, thereby connecting the first housing part to the second housing part. This may provide simple and reliable means for connecting the two housing parts to each other.

The handle may be configured to release a locking engagement of the hook-means by lifting the hook-means when the handle is extracted from the first housing part. This may provide for a continuous movement of the handle that both extracts the handle, releases the housing part's connection to each other and removes the first housing part form the second housing part.

The handle may comprise a grip-part and two substantially parallel legs extending away from the grip-part, wherein each leg comprises a hook-lifting cam configured to engage and lift a respective hook-means when the handle is extracted from the housing for thereby releasing the locking engagement. This may allow for a continuous movement of the handle that both extracts the handle, releases the housing part's connection to each other and removes the first housing part form the second housing part.

The handle may be a first handle arranged at a first side of the first housing part, and a second handle corresponding to the first handle may be arranged at a second side of the first housing part. This may be particularly suitable in the sense that removal of the first housing part from the second housing part is made even easier.

The first housing part of the housing may further comprise an exchangeable plate having one or more cut-outs for accommodating an electrical communication or connection port of the electronic circuit intended for a building control system. The feature of the exchangeable plate may allow for increased customization of the housing in that various types of exchangeable plates with different cut-outs for accommodating the electrical communication or connection port of the electronic circuit can be used in dependence of the purpose of the housing. Accordingly, a low-cost, easily adaptable exchangeable plate that enables customization of the cut-out for various connections can be provided.

The second housing part of the housing may further comprise at least one cut-out for electrical connectors, preferably two cut-outs arranged at respective opposites side of the housing. This may allow for several similar housings to be arranged next to each other and electrically connected to each other.

The second housing part may comprise attachment means for attachment to a wall of a building or, alternatively, to a rail of an electronic control module in the building.

The first and second housing parts may advantageously be made of plastic.

According to a second aspect of the present invention, there is provided a first housing part of a housing for an electronic circuit intended for a building control system, wherein the first housing part comprises said electronic circuit and is connectable to a second housing part for forming the housing when the first housing part is connected to the second housing part. A handle is movably attached to and extractable from the first housing part for providing a grip when the handle is extracted from the first housing part and thereby allowing, by pulling the handle when the first housing part is connected to the second housing part, the first housing part to be removed from the second housing part.

The first housing part may comprise a guide for guiding a movement of the handle in a direction away from the second housing part, when the first housing part is connected to the second housing part.

The handle may comprise a protrusion or recess that is configured to engage with a blocking member of the first housing part, when the handle is extracted from the first housing part, for thereby preventing the handle to be detached from the first housing part.

The handle may comprise a further protrusion or recess that is configured to engage with the guide of the first housing part, when the handle is inserted into the first housing part.

The handle may comprise a grip-part and two substantially parallel legs extending from the grip-part.

The first housing part may comprise hook-means that are configured to engage the second housing part in a locking manner, thereby connecting the first housing part to the second housing part.

The handle may be configured to release a locking engagement of the hook-means by lifting the hook-means when the handle is extracted from the first housing part.

The handle may comprise a grip-part and two substantially parallel legs extending away from the grip-part, wherein each leg comprises a hook-lifting cam configured to engage and lift a respective hook-means when the handle is extracted from the housing for thereby releasing the locking engagement.

The handle may be a first handle arranged at a first side of the first housing part, and a second handle corresponding to the first handle is arranged at a second side of the first housing part.

The first housing part may further comprise an exchangeable plate having one or more cut-outs for accommodating an electrical communication or connection port of the electronic circuit intended for a building control system.

The first housing part may be made of plastic.

According to a third aspect of the present invention, there is provided a second housing part of a housing for an electronic circuit intended for a building control system, wherein the second housing part is connectable to a first housing part according to the second aspect of the invention for forming the housing when the second housing part is connected to the first housing part.

The second housing part may comprise hook-means that are configured to engage the first housing part in a locking manner, thereby connecting the second housing part to the first housing part.

The second housing part may further comprise at least one cut-out for electrical connectors. Suitably, the second housing part may comprise two cut-outs for the electrical connectors, the cut-outs being arranged at respective opposites side of the second housing part.

The second housing part may comprise attachment means for attachment to a wall of a building or, alternatively, to a rail of an electronic control module in the building.

The second housing part may be made of plastic.

The second and third aspects may generally have the same features and advantages as the first aspect.

Other aspects, features and advantages of the present invention will appear from the following detailed disclosure of an exemplary embodiment of the invention, from the attached claims as well as from the drawings.

BRIEF DESCRIPTION OF THE DRAWINGS

Embodiments of the present invention will now be described, by way of example, with reference to the accompanying schematic drawings, in which.

DETAILED DESCRIPTION OF EMBODIMENTS

The present invention will now be described more fully hereinafter with reference to the accompanying drawings, in which an exemplary embodiment of the invention is shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout.

Figure 1:
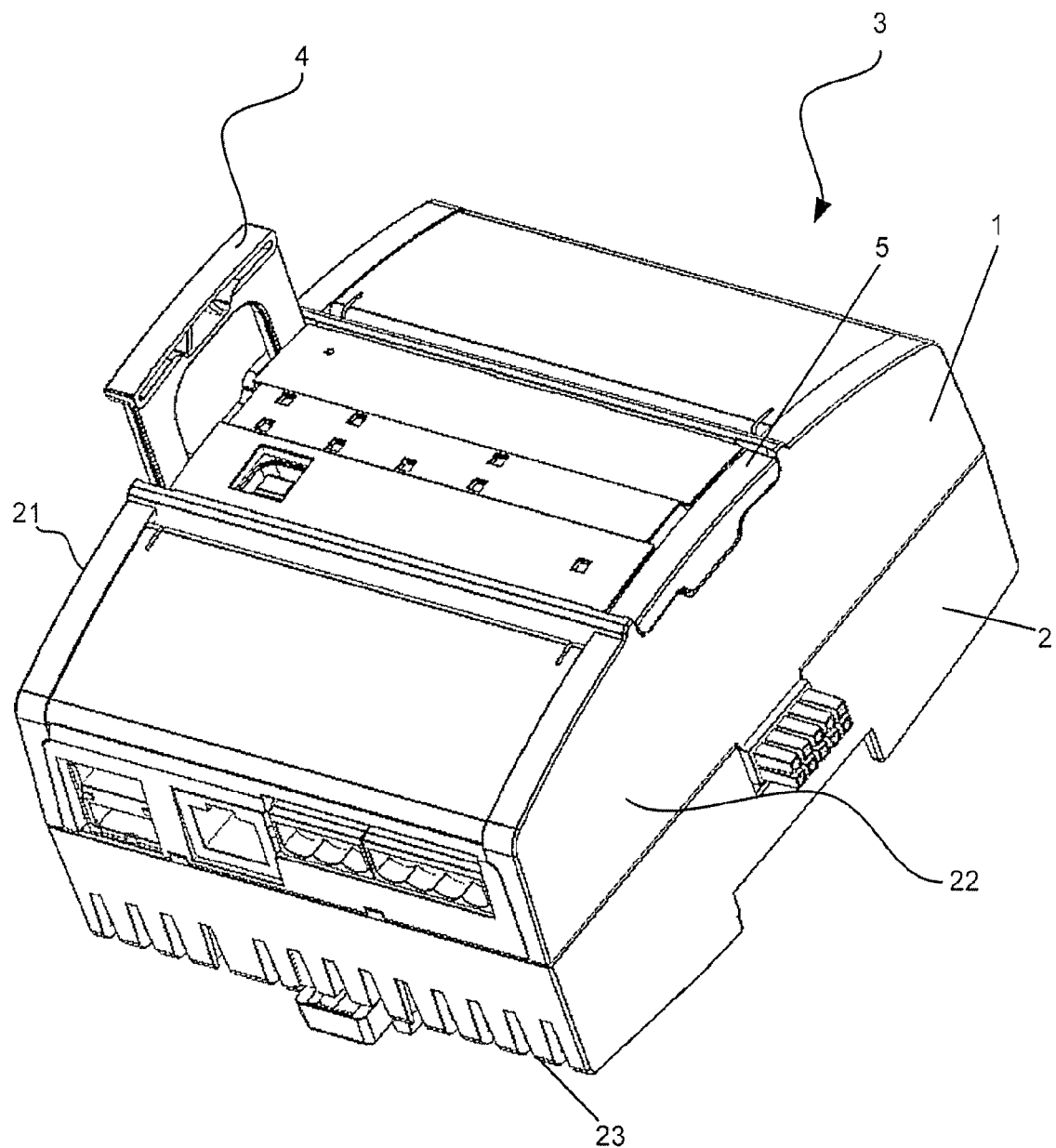
FIG. 1 is a perspective view of a housing.

FIG. 1 illustrates a housing or electronics housing 3. With reference to FIG. 1, the electronics housing 3 is illustrated with a first housing part 1 that acts as a cover connected to a second housing part 2 that acts as a base. One or both of the housing parts 1, 2 may be made of plastics. The housing 3 has a first handle 4 arranged at a first side 21 of the housing 3 and a second handle 5 arranged at a second side 22 of the housing opposite the first side 21. In FIG. 1, the first handle 4 is extracted from the housing 3 while the second handle 5 is in its innermost position. Both handles 4, 5 are extractable, e.g. movable in a direction parallel with the sides 21, 22. When arranged in a building, the second housing part 2 may be attached with its backside 23 to a rail (e.g. a DIN rail (not shown)) of a electronic control module located within a building. Alternatively, the second housing part 2 may be attached with its backside 23 to a wall (not shown) of the building, while the first housing part 1 faces away from the wall. Accordingly, the handles 4, 5 can be extracted in a direction perpendicular or almost perpendicular to the wall, or to the backside 23 of the second housing part 2.

Figure 2:
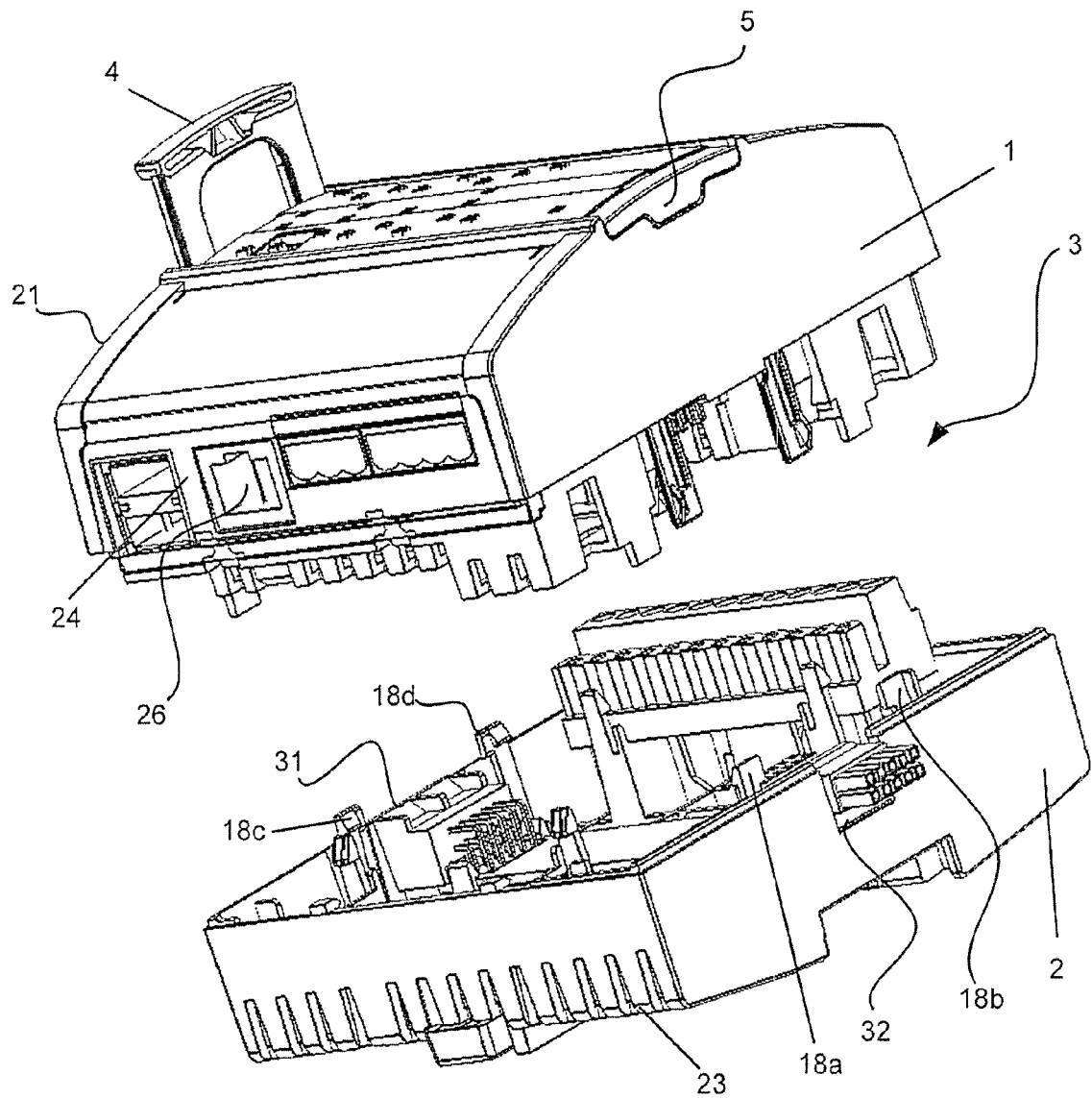
FIG. 2 is a perspective view of the housing of FIG. 1 with the two housing parts separated.

With further reference to FIG. 2, the housing 3 is illustrated with the first housing part 1 separated from the second housing part 2. In this exemplary embodiment, the first housing part 1 comprises one or several electronic circuits (not shown) intended for the building control system. In this exemplary embodiment, the second housing part 2 comprises one or more terminal blocks with wiring for connection to the building to be controlled. As can be seen in the FIGS. 1 and 2, when the first housing part 1 is connected to the second housing part 2, the two housing parts 1, 2 together form the housing 3. When the two parts 1, 2 are connected to each other, four hook-means 18a, 18b, 18c and 18d of the second housing part 2 engages a respective edge of the first housing part 1.

Figure 3:
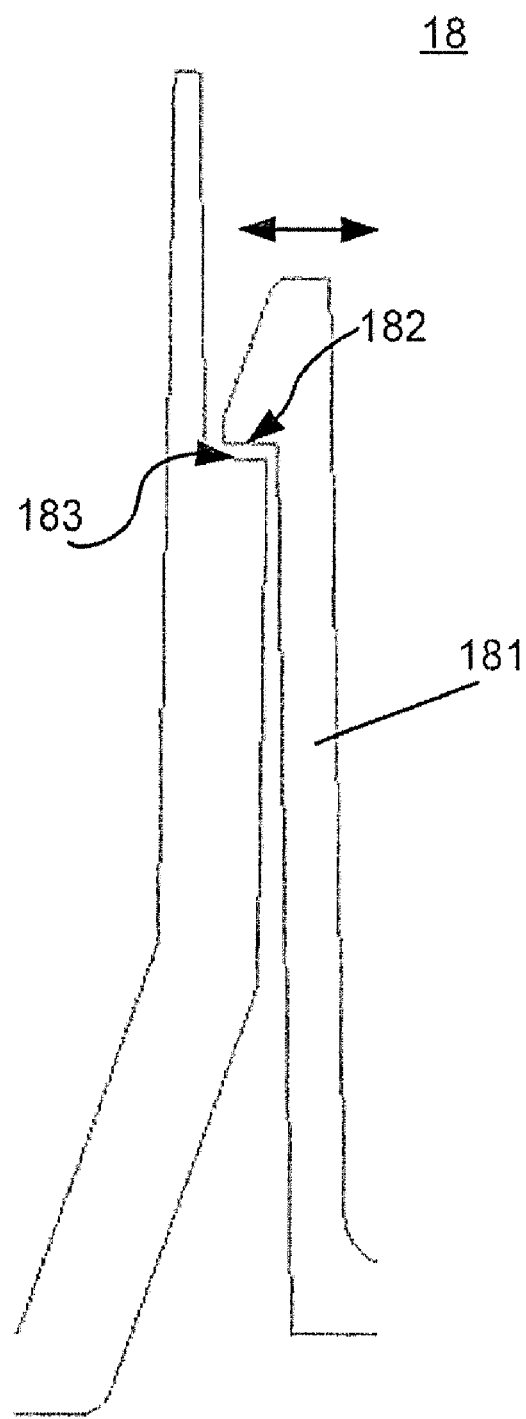
FIG. 3 illustrates a hook-means.

In further detail, FIG. 3 illustrates an exemplary hook-means 18 that has an elongated part 181 that extends in a direction from the backside 23 of the second housing part 2. The end of the elongated member 181 has a protrusion 182 that forms a hook-shape. The first housing part 1 has a corresponding edge 183 with which the hook-shaped protrusion 182 engages when the first housing part 1 is connected to the second housing part 2. When the first housing part 1 is moved in a direction towards the second housing part 2 for connection of the two parts 1, 2, the elongated member 181, which is flexible in a direction transverse the longitudinal direction of the elongated member 181, is biased in direction away from the edge 183, so that the protrusion 182 flexes back and engages the edge 183. Accordingly, when the two housing parts 1, 2 are to be separated from each other, the elongated member 181 can be bent away from the edge 183 such that the hook-shaped protrusion 182 is released from the first housing part 1. This bend-away functionality occurs when the handles 4, 5 are in their respective extracted positions thanks to a hook-lifting mechanism, described hereinbelow. The hock-means and its corresponding connection principle is well known within the art, and any conventional means having the same functionality may be used.

The sides 21, 22 of the housing 3 may have a respective cut-out 31, 32 for an electrical connector, for allowing several similar housings to be arranged next to each other and electrically connected to each other. In the illustrated embodiment, the cut-outs 31, 32 are arranged in the second housing part 2.

Figure 4:
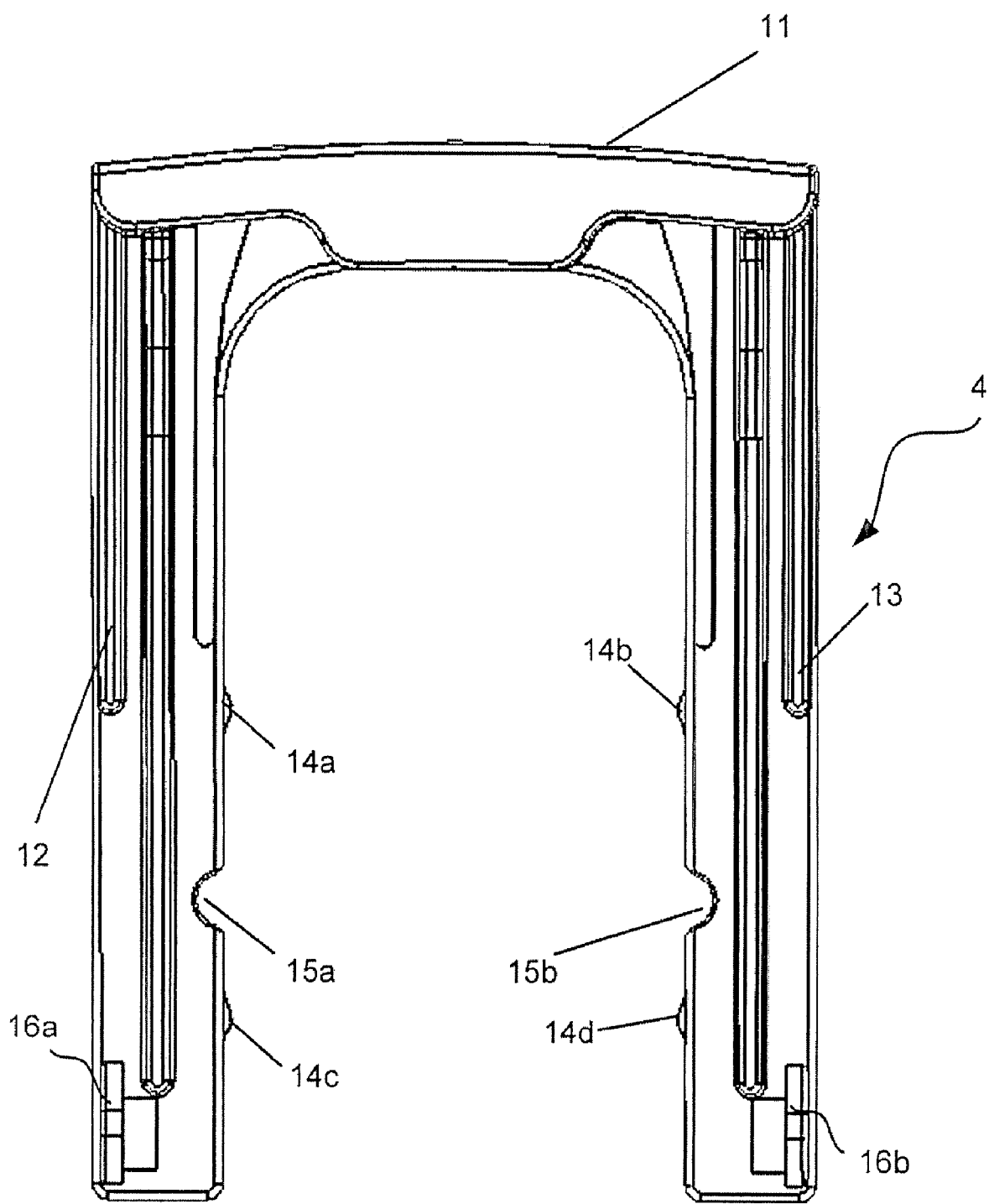
FIG. 4 is a front view of a handle.

FIG. 4 illustrates the first handle 4, which may advantageously be structurally and functionally identical with the second handle 5. The handle 4 may advantageously, but not necessarily, be U-shaped and may have a grip-part 11 from which two parallel legs 12, 13 extend. Each leg 12, 13 has a respective protrusion 14a, 14b and a respective cut-out 15a, 15b. Each leg may also have additional protrusions 14c, 14d.

Figure 5:
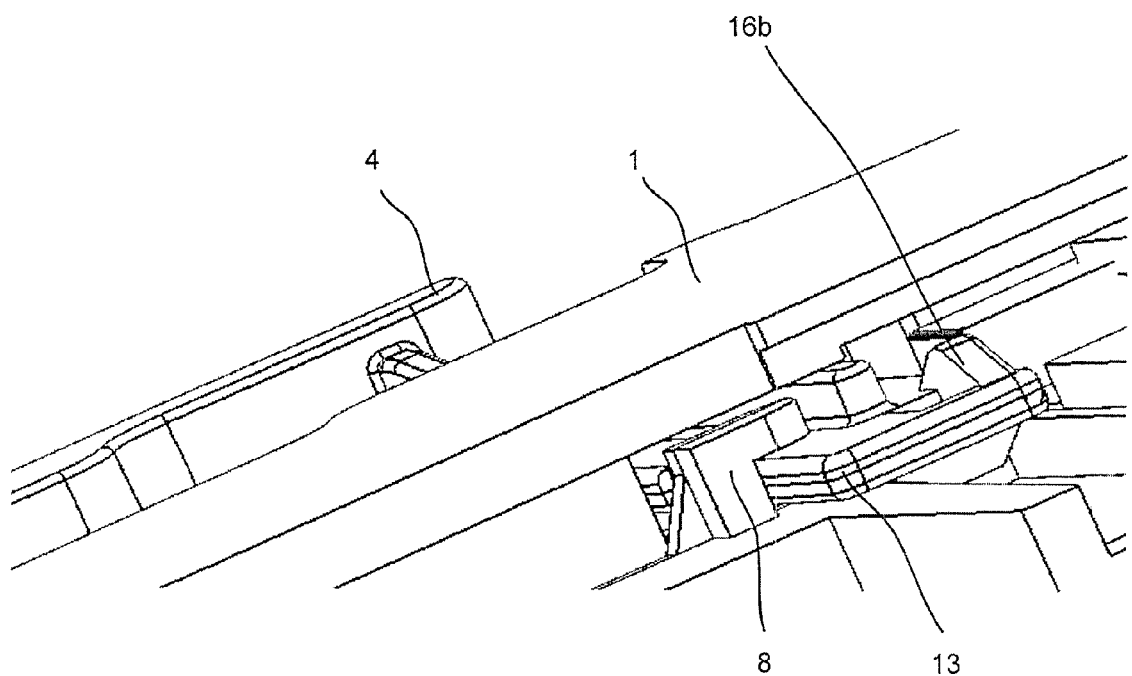
FIGS. 5, 6 and 7 are partial views of the handle and a first housing part.

With reference to FIG. 5, the leg 13 of the handle 4 can be guided by a guide 8 of the first housing part 1. The other leg (not shown in FIG. 5) can be guided by a corresponding guide of the first housing part 1. The guides of the first housing part 1 are arranged to control the movement, e.g. the extraction direction of the handle 4. Similarly, the second handle 5 comprises two parallel legs, which can be guided by corresponding guides of the first housing part 1.

Figure 6:
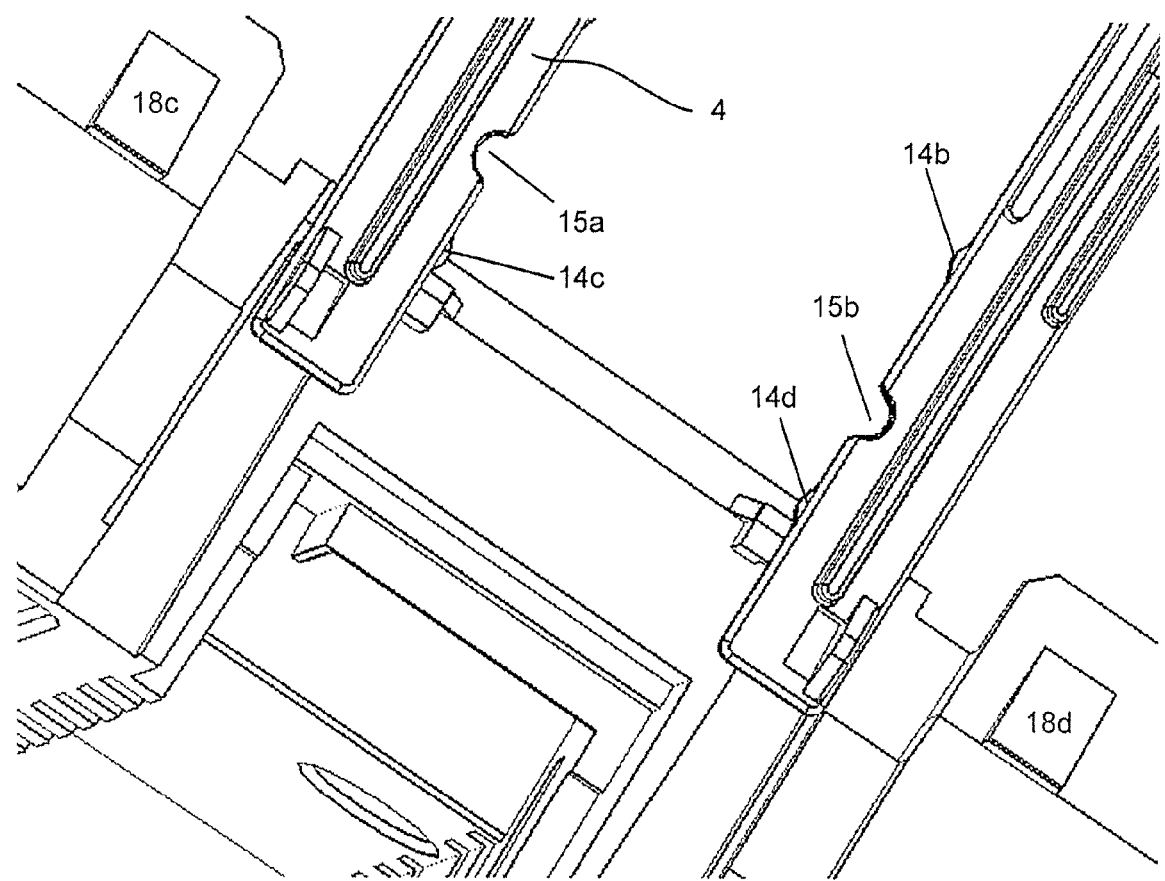
Figure 7:
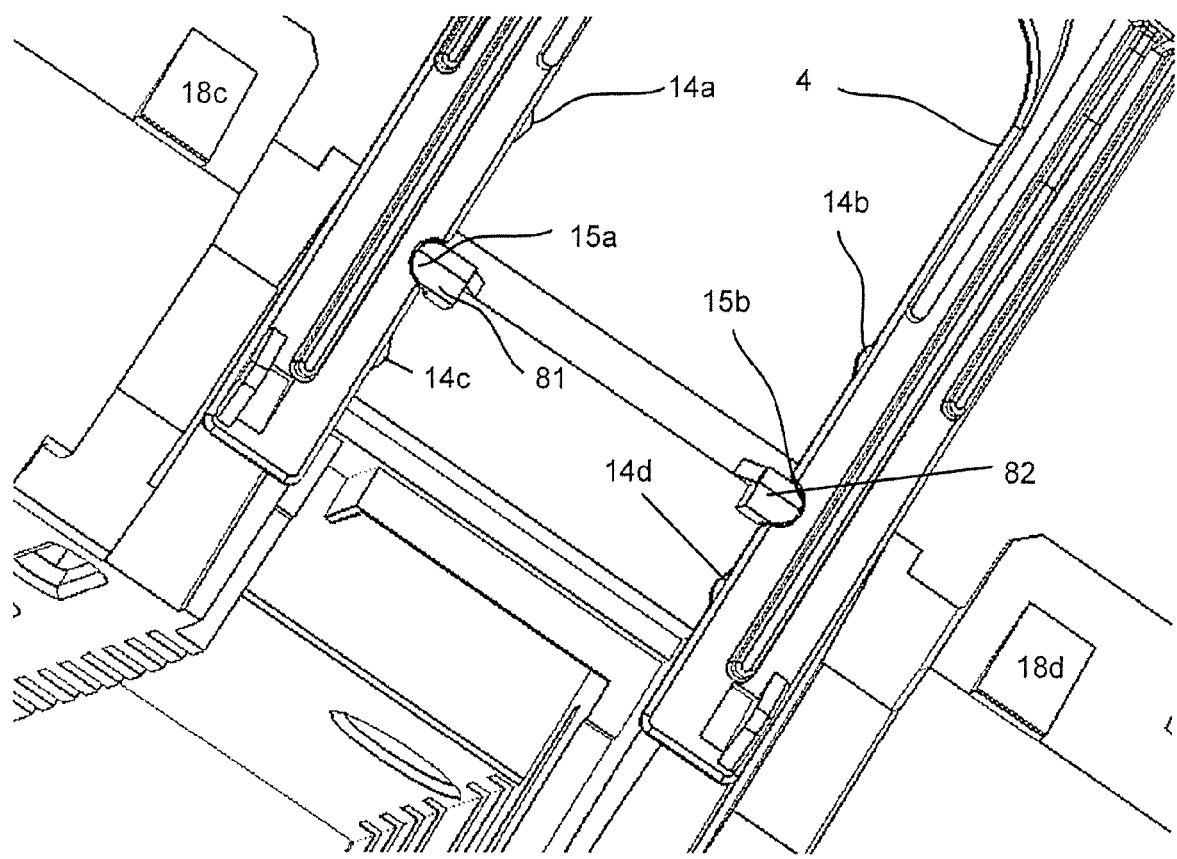

With reference to FIGS. 6 and 7, when the handle 4 is inserted in the first housing part 1 for the first time, the recesses 15a, 15b are configured to pass over corresponding detents 81, 82 of the guide 8 in the first housing part 1 and to fall into place underneath the detents as can be seen in FIG. 5. Once in this position, the handle movement may be limited to outer and inner positions. In an inner, inserted position of the handle 4 may be limited by the grip-part 11 abutting a front surface portion of the first housing part 2. In the inner position of the handle 4, the protrusions 14a, 14b may engage with the guide 8 in the first housing part 1 thereby preventing the handle from being extracting by its own weight when the housing is horizontally mounted, for example to a ceiling. In an outer, extracted position of the handle 4, the handle 4 may likewise be limited by protrusions 14c, 14d thereby preventing the handle from falling back when the housing 3 is horizontally mounted, for example to a floor.

Figure 8:
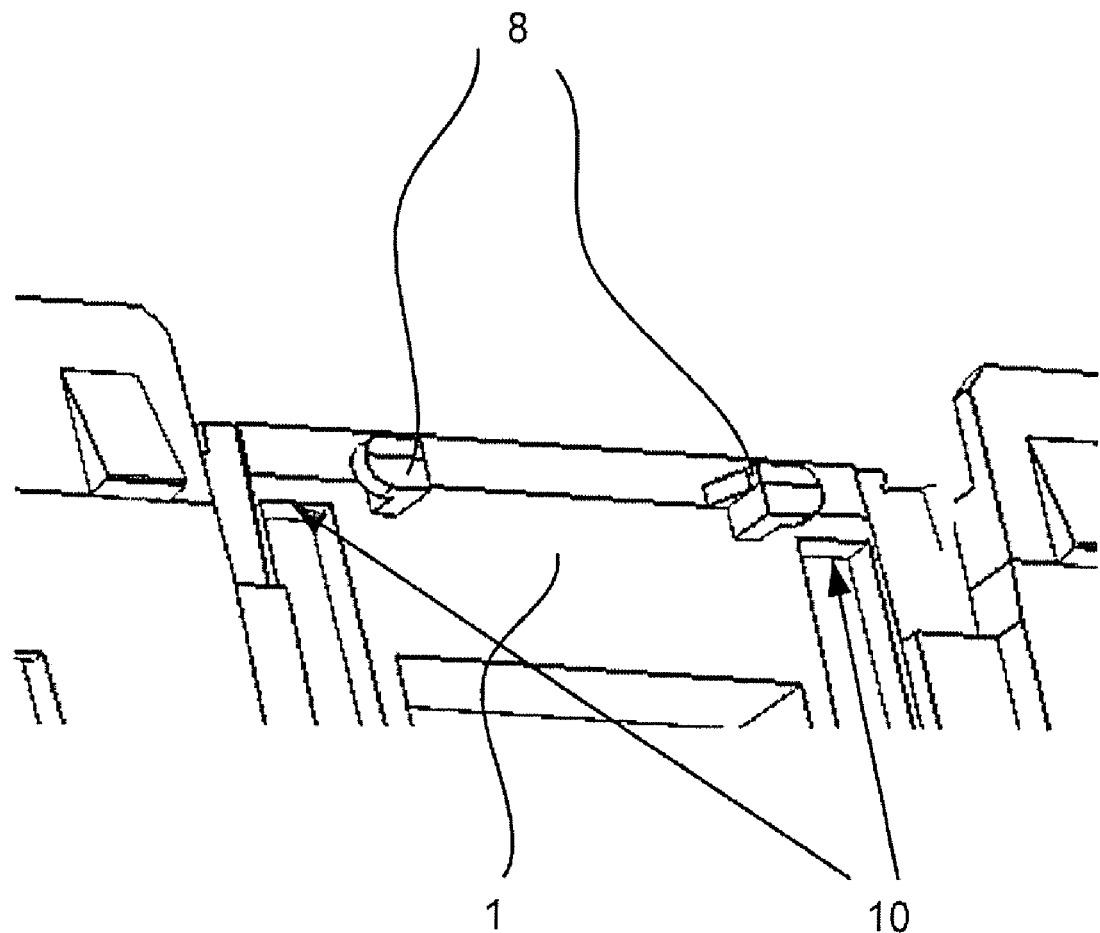
FIG. 8 illustrates a blocking member of the first housing part.

With reference to FIG. 8, an embodiment of a blocking member 10 of the first housing part 1 is illustrated. The handle 4 may comprise a protrusion (not shown), or alternatively a recess (not shown), that is configured to engage with the blocking member 10 of the first housing part 1 when the handle is extracted from the first housing part 1. This may allow for preventing the handle 4 from being detached from the first housing part 1 when the extraction force is applied to the handle 4 for extracting the handle 4 and separating the first housing part 1 from the second housing part 2.

Figure 9:
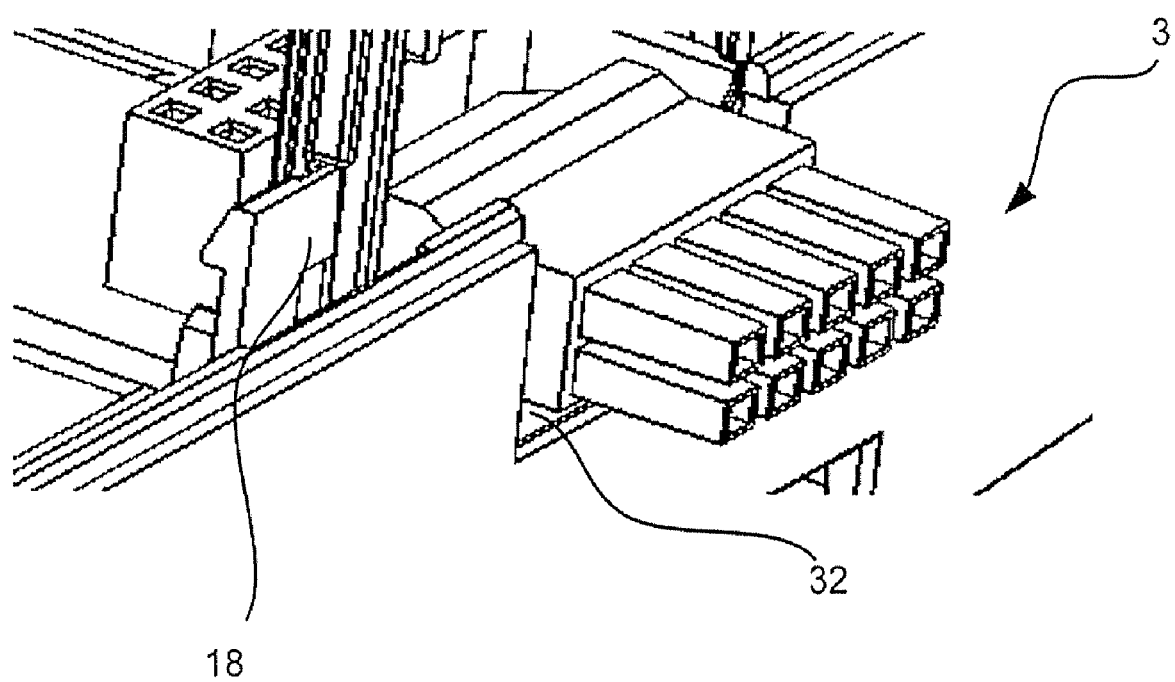
FIGS. 9 and 10 are partial views of the handle and the second housing part.
Figure 10:
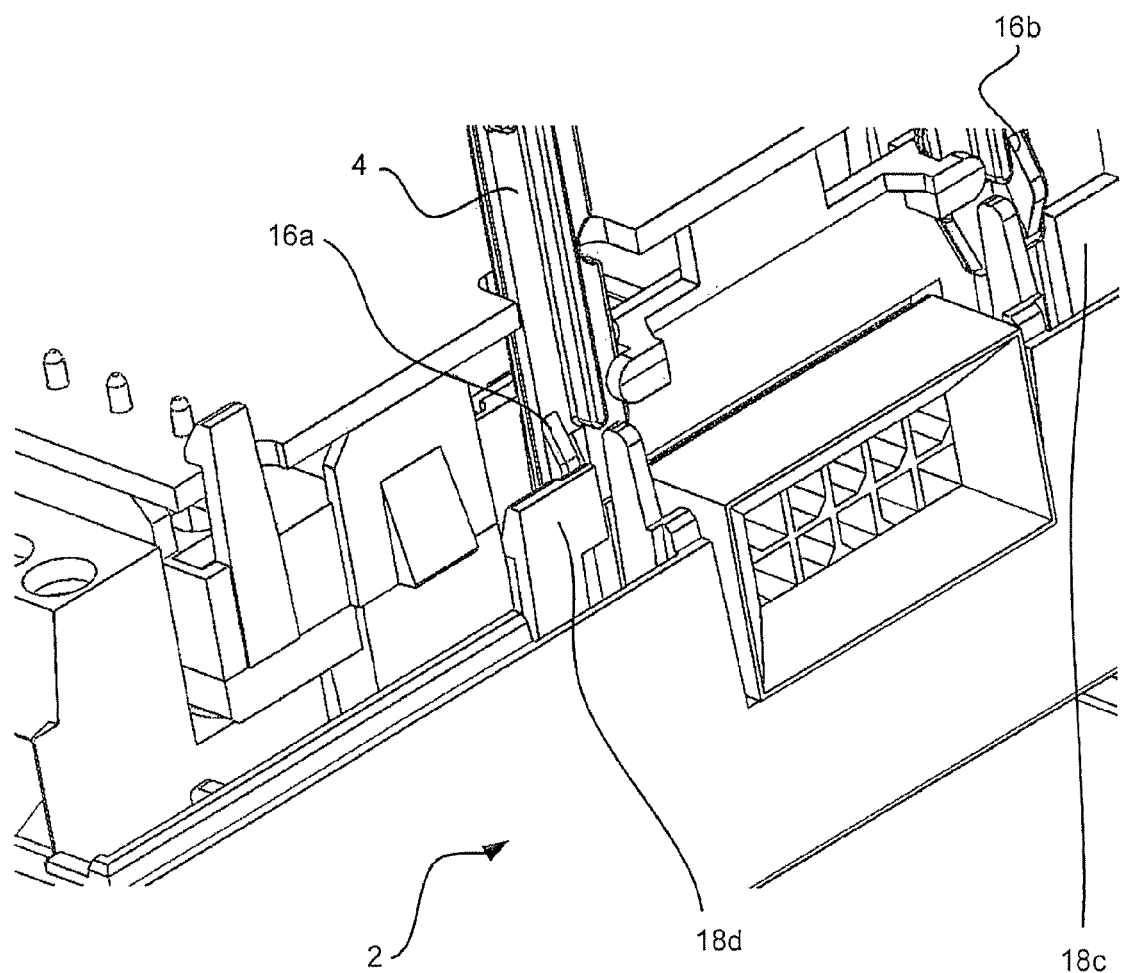

With further reference to FIGS. 9 and 10, each leg may have a hook-lifting cam 16a, 16b that is configured to engage and lift a respective hook-means 18d, 18c when the handle 4 is in its outermost position, i.e. when the handle 4 is extracted from the housing 3. The lifting of the hook-means results in, as earlier described, the elongated member 181 being bent away from the edge 183 such that the hook-means are released from the first housing part 1, thereby allowing the two housing parts 2, 3 to be separated.

Figure 11:
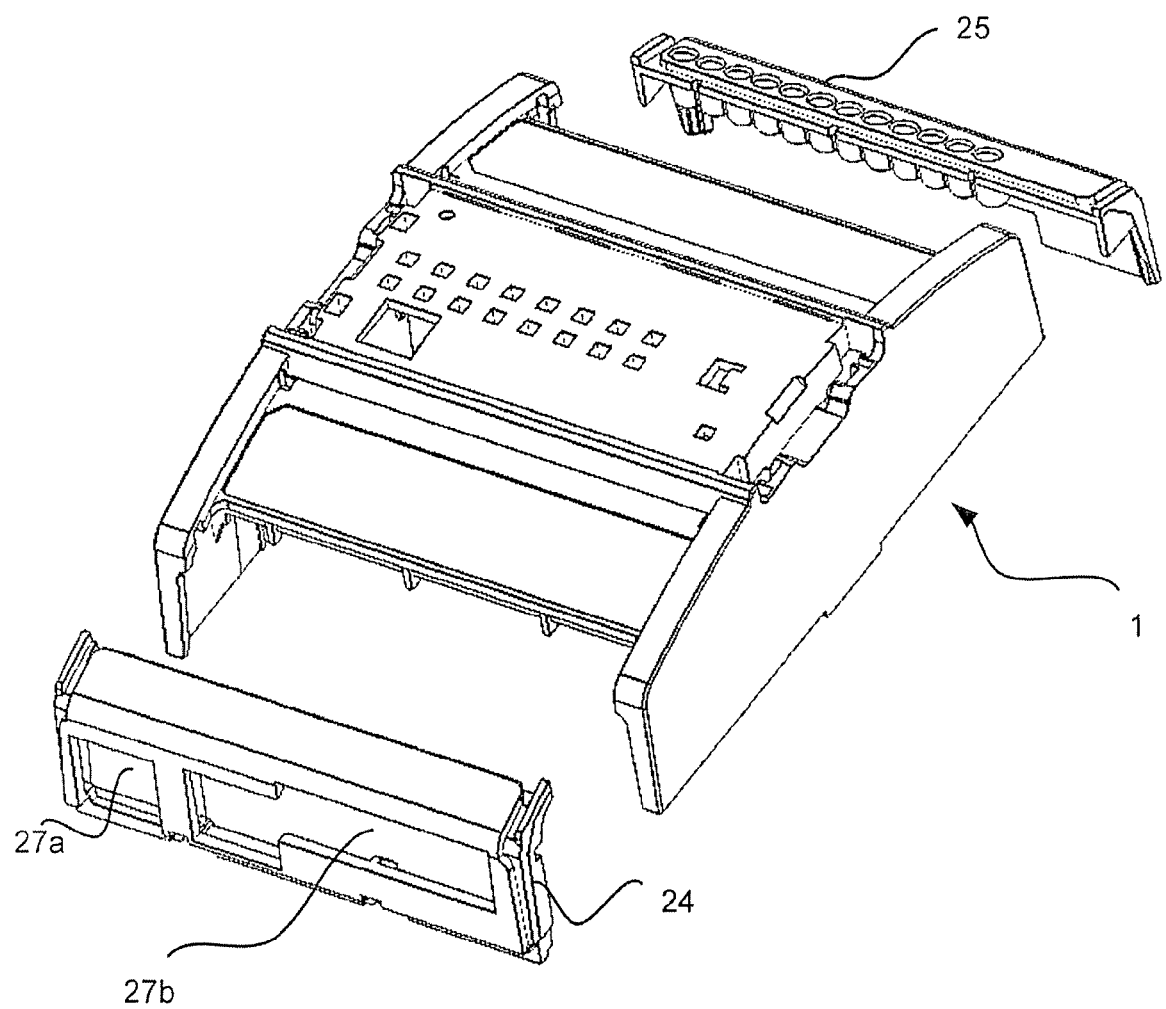
FIG. 11 is a perspective view of some elements of the first housing part.

Turning now to FIG. 11 in combination with FIG. 2, in this illustrative embodiment the first housing part 1 has a first removable panel 24 and, optionally, a second removable panel 25. Both panels 24, 25 are replaceable. The first panel has cut-outs 27a, 27b for accommodating an electrical communication or connection port 26 of electronic circuit intended for the building control system. Each cut-out of the first panel 24 has a shape that corresponds to the port it is intended to accommodate. The second panel 25 may have similar cut outs or may be provided with holes in the front as illustrated in FIG. 11 to access connector wiring screw terminals and additional cutouts along the edge to insert wires. Other possible forms that these panels 24, 25 could take would be to provide a plate with no holes to seal off access to internal components. A plate could also be designed with vents to provide convection cooling for internal components or any combination of these features. Both the first and second panels 24, 25 are replaceable so that a panel having suitable port cut-outs may be used. Each panel 24, 25 can be attached to the first housing part 1

Although the present invention has been described above with reference to certain embodiments, it is not intended to the specific forms set forth herein. Rather, the invention is limited only by the accompanying claims and, other embodiments than the specific above are equally possible within the scope of the appended claims, e.g. instead of having two handles, only one handle and corresponding hook-means may be used. Nevertheless, it should be appreciated that it may be advantageous to have two handles in order to allow for an evenly applied extraction force when separating the two housing parts from each other. Furthermore, instead of having one or more exchangeable plates, the first housing part may have no exchangeable plates and instead e.g. be made of a injection-molded single first housing part body.

Generally, all terms used in the claims are to be interpreted according to their ordinary meaning in the technical field, unless explicitly defined otherwise herein. The term "comprises/comprising" does not exclude the presence of other elements. Additionally, although individual features may be included in different claims, these may possibly advantageously be combined, and the inclusion in different claims does not imply that a combination of features is not feasible and/or advantageous. In addition, singular references do not exclude a plurality. The terms "a", "an", "first", "second" etc. do not preclude a plurality. Reference signs in the claims are provided merely as a clarifying example and shall not be construed as limiting the scope of the claims in any way.

The invention claimed is:

1. A first housing part of a housing for an electronic circuit intended for a building control system, wherein the first housing part comprises said electronic circuit and is connectable to a second housing part for forming the housing when the first housing part is connected to the second housing part, wherein
   a handle is movably attached to and extractable from the first housing part for providing a grip when the handle is extracted from the first housing part and thereby allowing, by pulling the handle when the first housing part is connected to the second housing part, the first housing part to be removed from the second housing part, wherein
   the first housing part further comprises hook-means that are configured to engage the second housing part in a locking manner, thereby connecting the first housing part to the second housing part, and wherein
   the handle comprises a grip-part and two substantially parallel legs extending away from the grip-part and wherein each leg comprises a hook-lifting cam configured to engage and lift a respective hook-means when the handle is extracted from the housing for thereby releasing the locking engagement.

2. The first housing part according to claim 1, comprising a guide for guiding a movement of the handle in a direction away from the second housing part, when the first housing part is connected to the second housing part.

3. The first housing part according to claim 2, wherein the handle comprises a protrusion or recess that is configured to engage with a blocking member of the first housing part, when the handle is extracted from the first housing part, for thereby preventing the handle to be detached from the first housing part.

4. The first housing part according to claim 2, wherein the handle comprises a further protrusion or recess that is configured to engage with the guide of the first housing part, when the handle is inserted into the first housing part.

5. The first housing part according to claim 1, wherein the handle comprises a protrusion or recess that is configured to engage with a blocking member of the first housing part, when the handle is extracted from the first housing part, for thereby preventing the handle to be detached from the first housing part.

6. The first housing part according to claim 5, wherein the handle comprises a further protrusion or recess that is configured to engage with the guide of the first housing part, when the handle is inserted into the first housing part.

7. The first housing part according to claim 1, wherein the handle comprises a further protrusion or recess that is configured to engage with the guide of the first housing part, when the handle is inserted into the first housing part.

8. The first housing part according to claim 1, wherein the handle is a first handle arranged at a first side of the first housing part, and a second handle corresponding to the first handle is arranged at a second side of the first housing part.

9. The first housing part according to claim 1, further comprising at least one exchangeable plate having one or more cut-outs for accommodating an electrical communication or connection port of the electronic circuit intended for the building control system.

10. A housing for an electronic circuit intended for a building control system, wherein the housing comprises:
    a first housing part, and
    a second housing part connected to the first housing part, wherein the first housing part comprises said electronic circuit and is connectable to the second housing part for forming the housing when the first housing part is connected to the second housing part, wherein
    a handle is movably attached to and extractable from the first housing part for providing a grip when the handle is extracted from the first housing part and thereby allowing, by pulling the handle when the first housing part is connected to the second housing part, the first housing part to be removed from the second housing part, wherein
    the first housing part further comprises hook-means that are configured to engage the second housing part in a locking manner, thereby connecting the first housing part to the second housing part, and wherein
    the handle comprises a grip-part and two substantially parallel legs extending away from the grip-part and wherein each leg comprises a hook-lifting cam configured to engage and lift a respective hook-means when the handle is extracted from the housing for thereby releasing the locking engagement.

11. The housing according to claim 10, wherein the second housing part comprises hook-means that are configured to engage the first housing part in a locking manner, thereby connecting the second housing part to the first housing part.

12. The housing according to claim 10, wherein the second housing part further comprises at least one cut-out for electrical connectors.

13. The housing according to claim 12, wherein the second housing part comprises two cut-outs for electrical connectors, wherein the two cut-outs are arranged at a respective opposite side of the second housing part.

14. A housing according to claim 10, wherein the first housing part comprises a guide for guiding a movement of the handle in a direction away from the second housing part, when the first housing part is connected to the second housing part.

15. A housing according to claim 10, wherein the handle comprises a protrusion or recess that is configured to engage with a blocking member of the first housing part, when the handle is extracted from the first housing part, for thereby preventing the handle to be detached from the first housing part.

16. A housing according to claim 10, wherein the handle comprises a further protrusion or recess that is configured to engage with the guide of the first housing part, when the handle is inserted into the first housing part.

* * * * *